(12) United States Patent
Seiler et al.

(10) Patent No.: US 11,476,664 B2
(45) Date of Patent: Oct. 18, 2022

(54) POWER MONITORING ADAPTERS

(71) Applicant: HEWLETT-PACKARD DEVELOPMENT COMPANY, L.P., Spring, TX (US)

(72) Inventors: Peter Seiler, Fort Collins, CO (US); Noel D Scott, Fort Collins, CO (US); Adolfo Adolfo Gomez, Fort Collins, CO (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 70 days.

(21) Appl. No.: 16/481,678

(22) PCT Filed: Mar. 23, 2018

(86) PCT No.: PCT/US2018/023940
§ 371 (c)(1),
(2) Date: Jul. 29, 2019

(87) PCT Pub. No.: WO2019/182603
PCT Pub. Date: Sep. 26, 2019

(65) Prior Publication Data
US 2021/0333331 A1 Oct. 28, 2021

(51) Int. Cl.
*H02J 1/10* (2006.01)
*G01R 31/40* (2020.01)
*G05F 1/625* (2006.01)
*H04L 25/02* (2006.01)
*G06F 1/28* (2006.01)
*G06F 1/26* (2006.01)

(52) U.S. Cl.
CPC .............. *H02J 1/106* (2020.01); *G01R 31/40* (2013.01); *G05F 1/625* (2013.01); *G06F 1/263* (2013.01); *G06F 1/28* (2013.01); *H02J 1/108* (2013.01); *H04L 25/02* (2013.01)

(58) Field of Classification Search
CPC . G06F 1/263; G06F 1/266; G06F 1/28; G06F 1/30; G06F 1/26; G06F 1/3206; G06F 1/3203; G06F 1/189; H02J 1/10; H02J 1/108; H02J 9/061; H02J 1/106; H02J 1/04
See application file for complete search history.

(56) References Cited

U.S. PATENT DOCUMENTS 8,103,907 B2   1/2012   Janick et al.
8,497,779 B1   7/2013   Waide
9,436,257 B2   9/2016   Munjal et al.
(Continued)

FOREIGN PATENT DOCUMENTS

RU        2398337 C1     8/2010

*Primary Examiner* — Ryan Johnson
(74) *Attorney, Agent, or Firm* — Fabian VanCott

(57) ABSTRACT

A power monitoring adapter may include a plurality of power supply unit (PSU) inputs to couple a plurality of PSUs to the power monitoring adapter. The power monitoring adapter may also include a power output to electrically couple the power monitoring adapter to a powered system. The power output includes a voltage line, and a ground. Further, the power monitoring adapter may include a side band interface to couple to the powered system. The side band interface communicates status data of the number of PSUs coupled to the power monitoring adapter.

20 Claims, 6 Drawing Sheets

(56) References Cited

U.S. PATENT DOCUMENTS

| | | | |
|---|---|---|---|
| 9,991,703 B1* | 6/2018 | Maroney | H02J 1/102 |
| 10,073,509 B2* | 9/2018 | Lin | G06F 1/263 |
| 2004/0003306 A1 | 1/2004 | Oomori | |
| 2005/0076249 A1* | 4/2005 | Kasprzak | G05F 1/40 |
| | | | 713/300 |
| 2005/0134239 A1 | 6/2005 | Harris et al. | |
| 2005/0184590 A1* | 8/2005 | Dobbs | H02J 9/061 |
| | | | 307/43 |
| 2008/0025058 A1 | 1/2008 | Gerber | |
| 2010/0064150 A1 | 3/2010 | Higuchi | |
| 2012/0124395 A1* | 5/2012 | Liang | G06F 1/26 |
| | | | 713/300 |
| 2014/0292070 A1 | 10/2014 | Poh et al. | |
| 2015/0236505 A1 | 8/2015 | Zhou et al. | |
| 2017/0255242 A1 | 9/2017 | Halpern et al. | |

* cited by examiner

POWER MONITORING ADAPTERS

BACKGROUND

A power supply unit (PSU) is an electrical device that supplies electric power to an electrical load such as a computing device. Some PSUs convert mains alternating current (AC) to low-voltage regulated direct current (DC) power for use by the components of a computing device. Other PSUs such as batteries or fuel cells, generators or alternators, solar power converters, or another power supply may provide DC power directly.

BRIEF DESCRIPTION OF THE DRAWINGS

The accompanying drawings illustrate various examples of the principles described herein and are part of the specification. The illustrated examples are given merely for illustration, and do not limit the scope of the claims.

Figure 1:
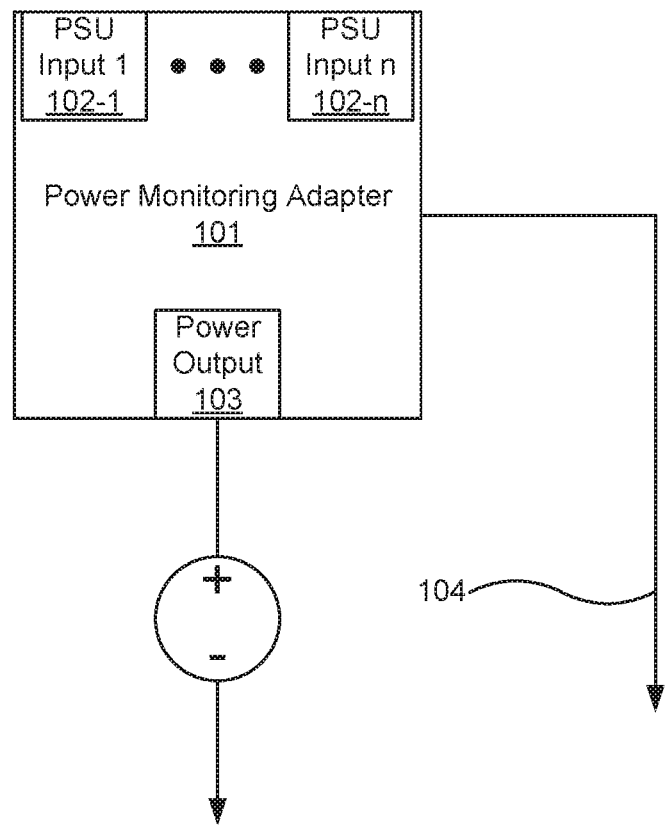
FIG. 1 is a block diagram of a power monitoring adapter, according to an example of the principles described herein.

Throughout the drawings, identical reference numbers designate similar, but not necessarily identical, elements. The figures are not necessarily to scale, and the size of some parts may be exaggerated to more clearly illustrate the example shown. Moreover, the drawings provide examples and/or implementations consistent with the description; however, the description is not limited to the examples and/or implementations provided in the drawings.

DETAILED DESCRIPTION

PSUs may be utilized in instances where electrical power cannot be interrupted or lost with respect to an electrical load such as a computing device. Some examples of situations where electrical power cannot be interrupted or lost with respect to a computing device may include military defense systems that utilize computing devices, hospitals where patients' lives are dependent on electrical power being constantly supplied to a computing device, an emergency services facility responsible for dispatch of first responders such as a 9-1-1 call center, among others. Providing multiple PSUs in a redundant manner decreases the possibility of such an interruption or loss of electrical power from occurring. An interruption or loss of electrical power to a computing system may result in data loss, damage to file structures, and interruption in processes provided by the computing system.

Redundant PSU systems may be used in connection with server computing devices. However, redundant PSU systems may be difficult to incorporate in to other form factor computing devices such as notebooks, virtual reality computing systems that are coupled to a user's back in a backpack form factor, and miniature desktop computing devices, among others. This may be due to the size of some redundant PSU systems and the costs associated with such a system.

Examples described herein provide a power monitoring adapter. The power monitoring adapter may include a plurality of PSU inputs to couple a plurality of PSUs to the power monitoring adapter. The power monitoring adapter may also include a power output to electrically couple the power monitoring adapter to a target powered system. The power output includes a voltage line, and a ground. Further, the power monitoring adapter may include a side band interface to couple to the target powered system. The side band interface communicates status data of the number of PSUs coupled to the power monitoring adapter.

The power monitoring adapter may include a PSU status module to determine a status of each of the PSUs coupled to the power monitoring adapter, and transmit data, via the side band interface, representing the status of each of the PSUs to the target powered system. The side band interface may include a wired or wireless network connection. Further, the power monitoring adapter may include a plurality of asymmetric conductance devices coupled between the power monitoring adapter and each of the PSUs to conduct current to the target powered system and restrict conductance of current to another PSU. The power monitoring adapter may include at least one status indicator to indicate at least one status parameter of the PSUs.

Examples described herein also provide a power supply system. The power supply system may include a plurality of power supply units (PSUs), and a power monitoring adapter. The power monitoring adapter may include a plurality of PSU inputs to couple the PSUs to the power monitoring adapter, and a power output to electrically couple the power monitoring adapter to a target powered system. The output may include a voltage line, and a ground. The power supply system may include a side band interface to couple to the target powered system, the side band interface communicating status data of the number of PSUs coupled to the power monitoring adapter.

The PSUs may each include a barrel jack. The barrel jack includes a voltage line, a ground, a communication conductor to communicate capabilities of the PSUs, or combinations thereof. Further, the power monitoring adapter may include power regulators to match power received from the PSUs to the requirements of a target power system. The power monitoring adapter may include a plurality of different input connection form factors to accept electromechanical coupling of PSUs with different output connection form factors.

The power monitoring adapter may include a plurality of asymmetric conductance devices coupled between the power monitoring adapter and each of the PSUs to conduct current to the target powered system and restrict conductance of current to another PSU. The power monitoring adapter may further include a PSU status module to determine a status of each of the PSUs coupled to the power monitoring adapter, and transmit data, via the side band interface, representing the status of each of the PSUs to the target powered system. The power supply system may include at least one status indicator to indicate at least one status parameter of the PSUs.

Examples described herein also provide a method for communicating a status of at least one power supply unit (PSU). The method may include, with a power monitoring adapter, identifying the coupling of a plurality of PSUs to the power monitoring adapter. The method may also include, with a PSU status module of the power monitoring adapter, identifying a status of the PSUs coupled to the power monitoring adapter. Further, the method may include, with a status indicator communicating, via a side band interface coupled between the power monitoring adapter and a target powered system, the status of the PSUs. The side band interface is separate from a power output of the power monitoring adapter used to power the target powered system.

The method may further include regulating power output from each of the PSUs coupled to the power monitoring adapter, and, with a number of asymmetric conductance devices coupled between the power monitoring adapter and each of the PSUs, restricting current conduction between PSUs. The method may include, with the PSU status module, identifying a number of parameters of each PSU coupled to the power monitoring adapter.

As used in the present specification and in the appended claims, the term "power supply unit (PSU)" is meant to be understood broadly as any device that is used to power an electrical device.

As used in the present specification and in the appended claims, the term "power monitoring adapter" is meant to be understood broadly as any device that monitors and controls the power supplied by a PSU to an electrical device.

As used in the present specification and in the appended claims, the term "power output" is meant to be understood broadly as any output from a power monitoring adapter that supplies power to an electrical device.

As used in the present specification and in the appended claims, the term "electrically couple" is meant to be understood broadly as a coupling of two electrical devices in which electrical power is provided from one electrical device to another.

As used in the present specification and in the appended claims, the term "powered system" is meant to be understood broadly as any device that is provided power from another device. In an example, the powered system may receive power from a PSU and/or a power monitoring adapter.

As used in the present specification and in the appended claims, the term "voltage line" is meant to be understood broadly as any electrical conductor through which electrical potential between two points in a circuit may be realized.

As used in the present specification and in the appended claims, the term "ground" is meant to be understood broadly as any reference point in an electrical circuit from which voltages are measured, and for which serves as a common return path for electric current.

As used in the present specification and in the appended claims, the term "side band interface" is meant to be understood broadly as any wired or wireless network connection or interface that serves as a data communication line to a powered system separate from a voltage line through which the powered system receives power.

As used in the present specification and in the appended claims, the term "communication" and its grammatical derivatives are meant to be understood broadly as the act of transmitting data from one electrical device to another.

As used in the present specification and in the appended claims, the term "status data" is meant to be understood broadly as any data that defines the characteristics and functioning status of an electrical device. In an example, the status data may include data regarding the characteristics and functioning status of a PSU.

As used in the present specification and in the appended claims, the term "PSU status module" is meant to be understood broadly as any combination of hardware and software used by the power monitoring adapter to monitor the characteristics and functioning status of an electrical device including, for example, a PSU.

As used in the present specification and in the appended claims, the term "wired network connection" is meant to be understood broadly as any interface between two electrical devices that utilizes electrical conductor as a transmission medium.

As used in the present specification and in the appended claims, the term "wireless network connection" is meant to be understood broadly as any interface between two electrical devices that does not utilize electrical conductor as a transmission medium.

As used in the present specification and in the appended claims, the term "asymmetric conductance device" is meant to be understood broadly as any device that restricts the flow of electricity in one direction. Stated another way an asymmetric conductance device has low (i.e., zero) resistance in one direction, and high (i.e., infinite) resistance in the other along a conductive path of a circuit.

As used in the present specification and in the appended claims, the term "status indicator" is meant to be understood broadly as any device that indicates a characteristic or functioning status of an electrical device. In an example, the status indicator may be any visual, auditory, or haptic device that may be presented to a user as feedback.

Turning now to the figures, FIG. 1 is a block diagram of a power monitoring adapter (101), according to an example of the principles described herein. The power monitoring adapter (101) may include a plurality of PSU inputs (102-1, 102-*n*, collectively referred to herein as 102) to couple a plurality of PSUs (FIG. 2, 105-1, 105-*n*) to the power monitoring adapter (101). Any number of PSU inputs (102) may be included within the power monitoring adapter (101), and the "n" of the PSU Input n (102-*n*) denotes that the power monitoring adapter (101) may include between one and an infinite number of PSU inputs (102). In an example, the power monitoring adapter (101) may include a plurality of PSU inputs (102). Further, in an example, the PSU inputs (102) may include a coaxial power connector or "barrel" connector form factor. The coaxial power connector may include a voltage line, a ground line, a communication conductor to communicate capabilities of the PSUs, or combinations thereof. However, the PSU inputs (102) may include any type of connector to couple with a mating connector of the PSUs (FIG. 2, 105-1, 105-*n*), and, in an example, may include a number of different types of form factors to couple PSUs (FIG. 2, 105-1, 105-*n*) with different coupling form factors to the power monitoring adapter (101).

Examples of different input types and form factors of the PSU inputs (102) include various sizes including diameters and lengths of DC coaxial power connector or "barrel" connector form factor. In another example, the PSU inputs (102) may include a printed circuit board (PCB) card edge connectors, serial AT attachment (SATA) power connectors, rectangular connectors, other DC power connectors, or combinations thereof. In an example, the PSU inputs (102) may include a plurality of different input connection form factors to accept electromechanical coupling of PSUs with different output connection form factors.

Figure 2:
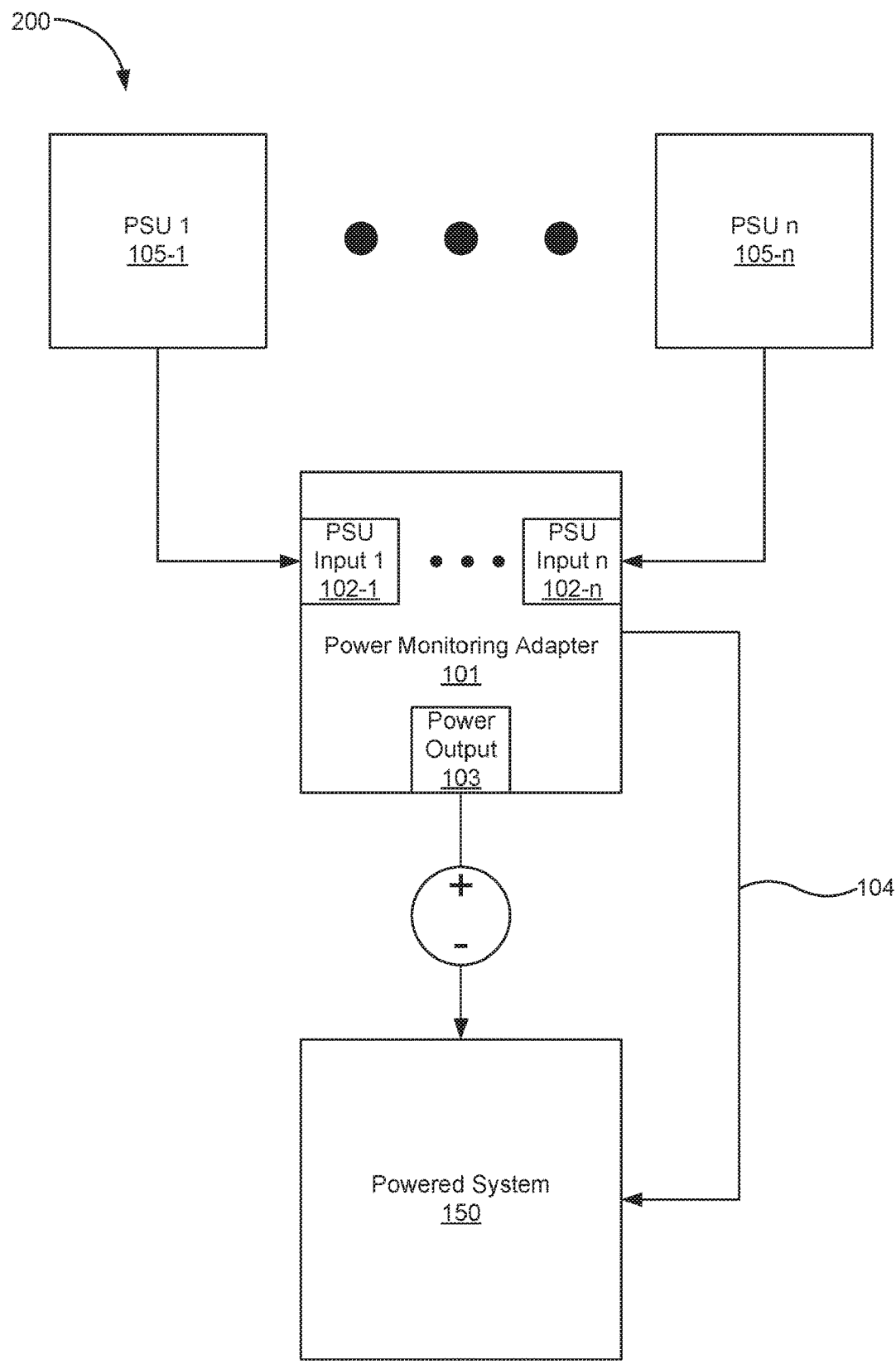
FIG. 2 is a block diagram of a power supply system, according to an example of the principles described herein.

The power monitoring adapter (101) may also include a power output (103) to electrically couple the power monitoring adapter (101) to a target powered system (FIG. 2, 150). The power output (103) includes a voltage line and a ground line, and may not include a data communications line. A side band interface (104) is included in the power monitoring adapter (101) to couple to the target powered system (FIG. 2, 150) and communicate status data associated with the PSUs (FIG. 2, 105-1, 105-n) coupled to the power monitoring adapter (101) to the target powered system (FIG. 2, 150). The side band interface (104) may include any wired or wireless network connection or interface including, for example, an IEEE 802.11 (i.e., Wi-Fi) connection, a BLUETOOTH™ connection, a wired connection using a universal serial bus (USB) interface, or other wired or wireless network connections or interfaces. The status data of the PSUs (FIG. 2, 105-1, 105-n) may include, for example, information regarding whether a direct current (DC) power source is present and on which of a given one of the PSU inputs (102) the DC power is present, data regarding those attached PSUs (FIG. 2, 105-1, 105-n), if the attached PSUs (FIG. 2, 105-1, 105-n) have a reporting interface, PSU (FIG. 2, 105-1, 105-n) failure events, data regarding whether the powered system (FIG. 2, 150) is running on battery power in examples where one of the PSUs is a battery and the power level of the battery, other data relevant to the presence and functioning status of the PSUs (FIG. 2, 105-1, 105-n) and the power monitoring adapter (101), other data, and combinations thereof. The status data may also include alerts to a user that may take the form of messages sent to the target powered system (FIG. 2, 150) or visual, audio, or haptic feedback devices present on the power monitoring adapter (101) or the target powered system (FIG. 2, 150).

FIG. 2 is a block diagram of a power supply system (200), according to an example of the principles described herein. The power supply system (200) may include the power monitoring adapter (101) described herein in connection with FIG. 1, The power monitoring adapter (101) may be coupled to at least two power supply units (PSUs) (105-1, 105-n, collectively referred to herein as 105). Any number of PSUs (105) may be included within the power supply system (200), and the "n" of the PSU n (102-n) denotes that the power supply system (200) may include between one and an infinite number of PSUs (105). In an example, the power supply system (200) may include a plurality of PSUs (105). The PSUs (105) may include any DC power source including, for example, any device that converts an alternating current (AC) power supply to a direct current (DC) power supply, or any device that produces an DC power supply such as a battery.

The power monitoring adapter (101) may be coupled between the PSUs (105) and a DC powered system (150), The DC powered system (150) may be any electrical device including computing devices whose electrical power source cannot be interrupted or lost. As described herein, there are many scenarios in which the power source of a computing device cannot be interrupted or lost, and include, for example, computing devices used in connection with military defense systems, emergency services such as police, fire, and other first responders, and hospitals, among others. Such an interruption or loss of electrical power to a computing system used in these types of scenarios may result in data loss, damage to file structures, and interruption in processes provided by the computing system, and may ultimately result in significant damage to a community and even loss of life. Thus, a plurality of redundant PSUs (105) are used to power the powered system (150) and reduce or eliminate the possibility of an interruption or loss of power to the powered system (150).

The side band interface (104) is coupled to the powered system (150) to communicate the status data as described herein. Further, the power output (103) is coupled to the powered system (150) to provide DC power to the powered system (150), In the examples described herein, the power output (103) does not transmit data. The side band interface (104) transmits any data to the powered system (150). Further, the power output (103) may include a coaxial power connector or "barrel" connector form factor. The power output (103) may include a coaxial power connector that includes a voltage line and a ground line.

In an example, the power output (103) and the side band interface (104) may be coupled in the same cable assembly. For example, a docking station may include docking cables or ports that use, for example, a DC barrel jack for the power output (103) and a USB type-C interface for the side band interface (104). This example provides for cable management, and may leverage cable assemblies that the users powered device (150) may use.

Figure 3:
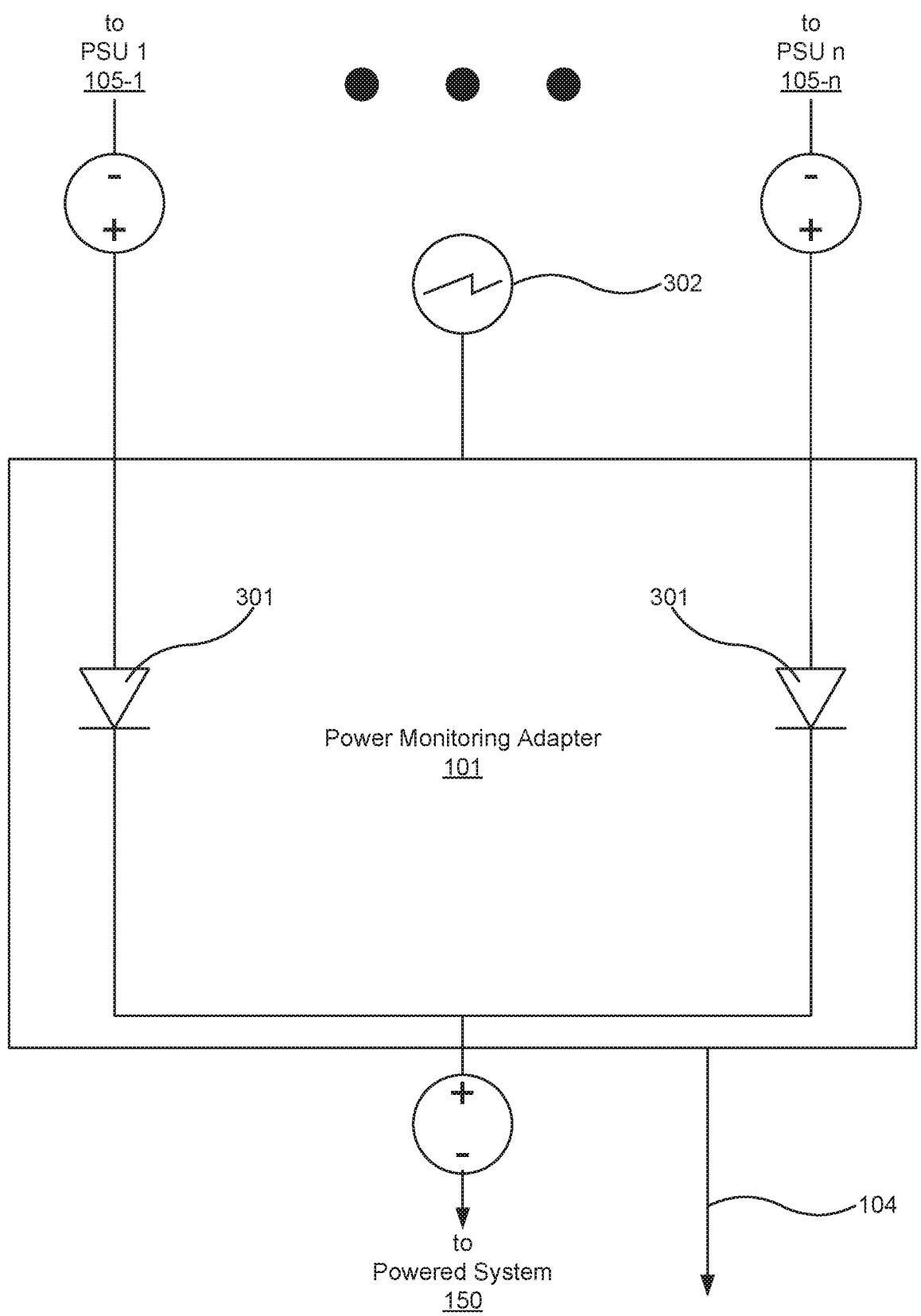
FIG. 3 is a block diagram of a power monitoring adapter, according to another example of the principles described herein.

FIG. 3 is a block diagram of the power monitoring adapter (101), according to another example of the principles described herein. In the example of FIG. 3, an asymmetric conductance device (301-1, 301-n, collectively referred to herein as 301) is coupled between the power monitoring adapter (101) and each of the PSUs (105) to conduct current to the target powered system (150), while, at the same time restricting conductance of current to another PSU (105). The multiple input voltages provided by the plurality of PSUs (105) may be isolated from one another using the asymmetric conductance devices (301). In an example, the asymmetric conductance devices (301) may be diodes. However, any device that restricts the flow of electricity in one direction or has low (i.e., zero) resistance in one direction, and high (i.e., infinite) resistance in the other may be used as the asymmetric conductance devices (301).

In an example, the power monitoring adapter (101) may also include an indicator (302) to indicate to a user a status of the power monitoring adapter (101), the PSUs (105) coupled to the power monitoring adapter (101), or combinations thereof. The indicator (302) may be any device that may inform a user of the status, and may include, for example, a light emitting diode, a haptic feedback device, an audible feedback device, other feedback devices, or combinations thereof.

In an example, the indicator (302) may also include a message generator that generates a message for display to a user. In this example, the indicator (302) may include a display device that displays information associated with the status data to the PSUs (105), the power monitoring adapter (101), and combinations thereof. Further, the indicator (302) may generate and send a message to the computing system (150) via the side band interface (104) or via wireless protocol. Further, in an example, the message may be sent to another device or user including, for example, a system administrator via a wired or wireless protocol. These messages may inform the user whether a DC power source is present and on which of a given one of the PSU inputs (102) the DC power is present, data regarding those attached PSUs (105), if the attached PSUs (105) have a reporting interface, PSU (105) failure events, other data relevant to the presence and functioning status of the PSUs (105) and the power monitoring adapter (101), other data, and combinations thereof.

Figure 4:
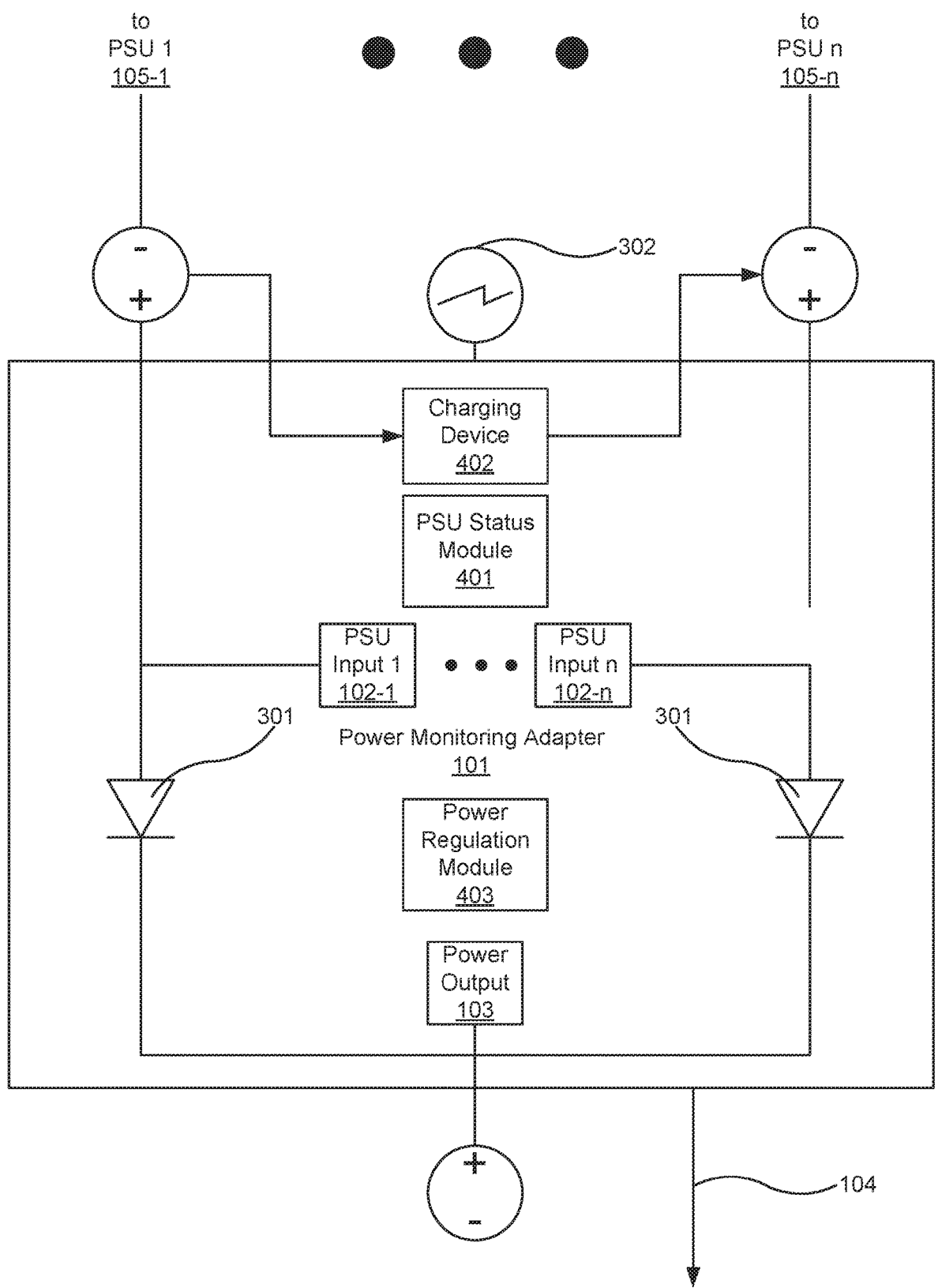
FIG. 4 is a block diagram of a power monitoring adapter, according to yet another example of the principles described herein.

FIG. 4 is a block diagram of the power monitoring adapter (101), according to yet another example of the principles described herein. The power monitoring adapter (101) may include a PSU status module (401). The PSU status module (401) may be digital memory or logics that when executed or activated, determine a number of characteristics of the PSUs (105) coupled to the power monitoring adapter (101). Using the data generated by the PSU status module (401), the power monitoring adapter (101) may regulate and balance the PSU (105) input sources to ensure that the PSUs (105) provide an appropriate amount of power to the powered system (150).

In an example, power regulation modules (403) may be included in the power monitoring adapter (101) to match power received from the PSUs (105) to the requirements of the target power system (150). For example, the first PSU (105-1) may supply power to the power monitoring adapter (101) at 19.5 volts (V). The target powered system (150) in this example may be able accept power at 12V. In this scenario, the path through the power monitoring adapter (101) is through one of the power regulation modules (403) which converts power at 19.5V to power at 12V for consumption by the target powered system (150), The PSU status module (401) and/or the power regulation module (403) may exist within the power monitoring adapter (101) as a single element or as separate elements. In this manner, the PSU status module (401) and/or the power regulation module (403) serve as a power regulator to ensure that the power received from the PSUs (105) is matched to the requirements of the target power system (150). In an example, the power monitoring adapter (101) may match a power requirement of the powered system (150) by controlling the input loads of the PSUs (105), The power monitoring adapter (101) may include between 1 and M number of power regulation modules (403) with switchable paths that allow between 1 and N number of PSU inputs (102) to be routed through one of the power regulation modules (403).

In an example, a PSU (105) may be connected to the power monitoring adapter (101), and the PSU's (105-1) power output may be routed through a power regulation module (403) depending on whether the power form the PSU (105-1) is to be regulated. After the power form the PSU (105-1) has been run through the power regulation module (403) (or not, depending on whether regulation of the power was necessary), that output might be blended with power supplied by another PSU (105-n) connected to another PSU inputs (102-n) of the power monitoring adapter (101). The input power from the other PSU (105-n) may or may not have been run through a power regulation module (403) before being blended through the corresponding asymmetric conductance devices (301).

In examples where one of the PSUs (105) is a battery, the power monitoring adapter (101) may also include a charging device (402) to charge the battery. The Examiner of FIG. 4 includes the charging device (402) coupled between an input of a first PSU (105-1) and a second PSU (105-n) where the second PSU (105-n) is the battery and is charged by the first PSU (105-1).

Figure 5:
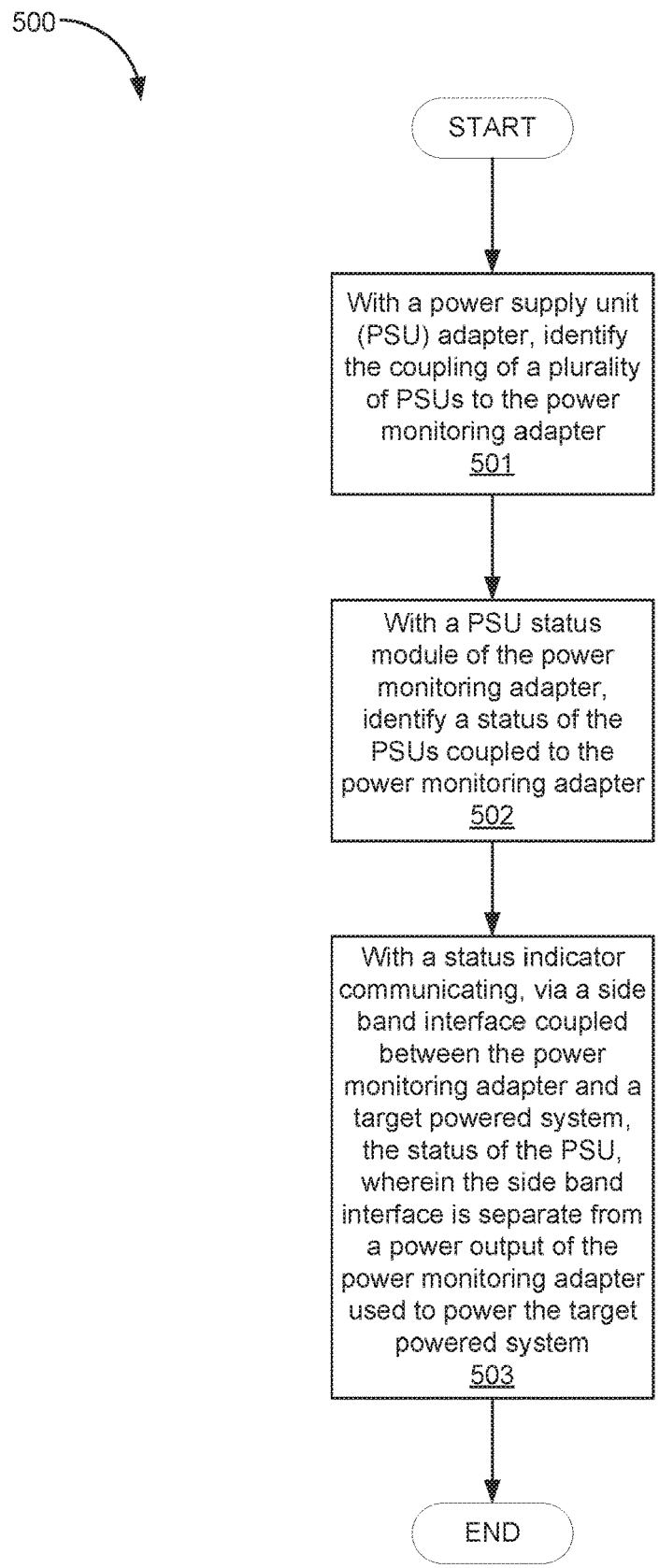
FIG. 5 is a flowchart showing a method of communicating a status of at least one PSU, according to an example of the principles described herein.

FIG. 5 is a flowchart showing a method (500) of communicating a status of at least one PSU (105), according to an example of the principles described herein. The method (500) may include, with a power monitoring adapter (101), identifying (block 501) the coupling of a plurality of PSUs (105) to the power monitoring adapter (101). In an example, the PSU status module (FIG. 4, 401) of the power monitoring adapter (101) may detect when a PSU (105) is coupled to the power monitoring adapter (101). Further, the PSU status module (401) of the power monitoring adapter (101) may identify (block 502) a status of the PSUs (105) coupled to the power monitoring adapter. The status indicator (302) may communicate (block 503), via the side band interface (104) coupled between the power monitoring adapter (101) and the target powered system (150), the status of the PSUs (105). In an example, the side band interface (104) is separate from the power output (103) of the power monitoring adapter used to power the target powered system (150).

Figure 6:
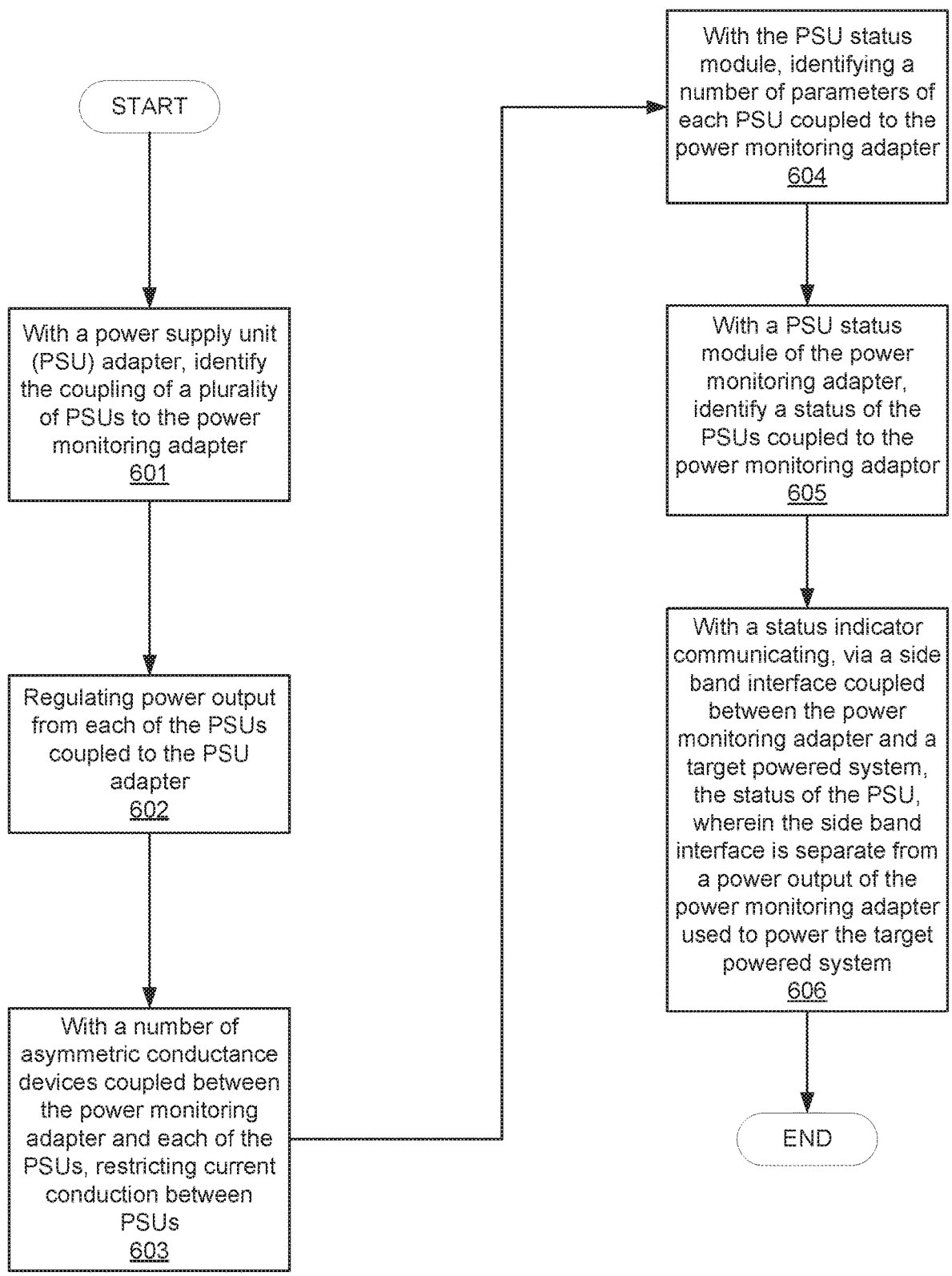
FIG. 6 is a flowchart showing a method for communicating a status of at least one PSU, according to an example of the principles described herein.

FIG. 6 is a flowchart showing a method (600) of communicating a status of at least one PSU (105), according to another example of the principles described herein. The method (600) of FIG. 6 may include, with a power monitoring adapter (101), identifying (block 601) the coupling of a plurality of PSUs (105) to the power monitoring adapter (101). In an example, the PSU status module (FIG. 4, 401) of the power monitoring adapter (101) may detect when a PSU (105) is coupled to the power monitoring adapter (101). The method may also include regulating (block 602) power output from each of the PSUs (105) coupled to the power monitoring adapter (101).

A number of asymmetric conductance devices (301) coupled between the power monitoring adapter (101) and each of the PSUs (105) may be used to restrict (block 603) current conduction between PSUs (105). Further, the PSU status module (401) of the power monitoring adapter (101) may identify (block 604) a number of parameters of each PSU (105) coupled to the power monitoring adapter (101). The parameters of the PSUs (105) may include, the output voltage of the PSUs (105), the brand, model number, or type of PSU (105), the current output of the PSUs (105), other parameters, and combinations thereof. Other parameters may include input capabilities of the PSUs (105). The input capabilities of the PSUs (105) may be communicated to the power monitoring adapter (101), interpreted by the PSU status module (401), and communicated to the powered system (150). This may be performed before the powered system (150) processes its power-on self-test (POST) and initialization of the various components of the powered system (150). This will allow for the negotiation of power requirements within the powered system (150) and determine if the output of the PSUs (105) are sufficient to power the powered system (150) and its components.

Further, the PSU status module (401) of the power monitoring adapter (101) may identify (block 605) a status of the PSUs (105) coupled to the power monitoring adapter. The status indicator (302) may communicate (block 606), via the side band interface (104) coupled between the power monitoring adapter (101) and the target powered system (150), the status of the PSUs (105). In an example, the side band interface (104) is separate from the power output (103) of the power monitoring adapter used to power the target powered system (150).

The specification and figures describe a power monitoring adapter. The power monitoring adapter may include a plurality of PSU inputs to couple a plurality of PSUs to the power monitoring adapter. The power monitoring adapter may also include a power output to electrically couple the power monitoring adapter to a target powered system. The power output includes a voltage line, and a ground. Further, the power monitoring adapter may include a side band interface to couple to the target powered system. The side band interface communicates status data of the number of PSUs coupled to the power monitoring adapter.

The power monitoring adapter may be used between multiple devices and form factors with a common DC power interface. The solution allows a user to connect multiple PSUs to a target powered system which allows for fail over as well as load balancing, which may increase the life of the PSUs over the long term. By ganging multiple PSUs in parallel as presented herein, the current-deliver capacity may be extended past what a single PSU could provide, and, thus, there may be more power-hungry configurations that may be supported, or there could be opportunities for reduction in purchasing different types of PSUs in cases where an IT department or vendor may desire to carry one type of PSU for spares as opposed to two different types to accommodate different power requirements. Further, there may be cases where PSU inputs of different makes, models, and manufacturers, may be used to utilize spare PSUs. Even further, examples where a battery source is used in conjunction with an AC/DC PSU may allow for the adapter to be used as an emergency battery backup adapter.

The preceding description has been presented to illustrate and describe examples of the principles described. This description is not intended to be exhaustive or to limit these principles to any precise form disclosed. Many modifications and variations are possible in light of the above teaching.

What is claimed is:

1. A power monitoring adapter, comprising:
   a plurality of power supply unit (PSU) inputs to couple a plurality of PSUs to the power monitoring adapter;
   a power output connector to electrically couple the power monitoring adapter to an external powered system, the power output comprising:
      a voltage line; and
      a ground;
   a side band interface to couple to the external powered system, the side band interface communicating status data of the number of PSUs coupled to the power monitoring adapter; and
   a charging device to charge, with a first PSU coupled to a first PSU input, a second PSU coupled to a second PSU input.

2. The power monitoring adapter of claim 1, further comprising a PSU status module to:
   determine a status of each of the PSUs coupled to the power monitoring adapter; and
   transmit data, via the side band interface, representing the status of each of the PSUs to the powered system.

3. The power monitoring adapter of claim 1, wherein the side band interface comprises a wired network connection.

4. The power monitoring adapter of claim 1, comprising a plurality of asymmetric conductance devices coupled between the power monitoring adapter and each of the PSUs to conduct current to the powered system and restrict conductance of current to another PSU.

5. The power monitoring adapter of claim 1, comprising a status indicator to indicate a status parameter of the PSUs.

6. The power monitoring adapter of claim 1, wherein the side band interface comprises a wireless network connection.

7. The power monitoring adapter of claim 5, wherein the status indicator comprises a message generator to generate a message for display to a user.

8. A power supply system comprising:
   a plurality of power supply units (PSUs);
   a power monitoring adapter comprising:
      a plurality of PSU inputs to couple the PSUs to the power monitoring adapter;
      a power output connector to electrically couple the power monitoring adapter to an external powered system, the power output comprising:
         a voltage line; and
         a ground;
      a side band interface to couple to the external powered system, the side band interface communicating status data of the number of PSUs coupled to the power monitoring adapter; and
      a charging device to charge, with a first PSU coupled to a first PSU input, a second PSU coupled to a second PSU input.

9. The power supply system of claim 8, wherein the PSUs each comprise a barrel jack, the barrel jack comprising a voltage line, a ground, a communication conductor to communicate capabilities of the PSUs, or combinations thereof.

10. The power supply system of claim 8, wherein the power monitoring adapter comprises a power regulator to match power received from the PSUs to the power requirements of the powered system.

11. The power supply system of claim 8, wherein the power monitoring adapter comprises a plurality of different input connection form factors to accept electromechanical coupling of PSUs with different output connection form factors.

12. The power supply system of claim 8, wherein the power monitoring adapter comprises a plurality of asymmetric conductance devices coupled between the power monitoring adapter and each of the PSUs to conduct current to the powered system and restrict conductance of current to another PSU.

13. The power supply system of claim 8, wherein the power monitoring adapter further comprises a PSU status module to:
   determine a status of each of the PSUs coupled to the power monitoring adapter; and
   transmit data, via the side band interface, representing the status of each of the PSUs to the powered system.

14. The power supply system of claim 8, comprising a status indicator to indicate a status parameter of the PSUs.

15. The power supply system of claim 8, wherein the power output connector and the side band interface are in a same cable assembly.

16. The power supply system of claim 15, wherein the power output connector is a DC barrel jack and the side band interface is a USB type-C interface in the same cable assembly.

17. A method for communicating a status of a power supply unit (PSU) comprising:
   with a power monitoring adapter, identifying the coupling of a plurality of PSUs to the power monitoring adapter;
   with a PSU status module of the power monitoring adapter, identifying a status of the PSUs coupled to the power monitoring adapter;
   with a status indicator communicating, via a side band interface coupled between the power monitoring adapter and a powered system, the status of the PSUs, wherein the side band interface is separate from a power output of the power monitoring adapter used to power the powered system, and
   charging, with a first PSU, a second PSU via a charging device between the first PSU and the second PSU.

18. The method of claim 17, comprising:
   regulating power output from each of the PSUs coupled to the power monitoring adapter; and
   with a number of asymmetric conductance devices coupled between the power monitoring adapter and each of the PSUs, restricting current conduction between PSUs.

19. The method of claim 17, comprising, with the PSU status module, identifying a number of parameters of each PSU coupled to the power monitoring adapter.

20. The method of claim 17, further comprising blending power supplied by the first PSU and the second PSU.

* * * * *